(12) United States Patent
Xu et al.

(10) Patent No.: US 10,459,552 B2
(45) Date of Patent: Oct. 29, 2019

(54) ARRAY SUBSTRATE, METHOD FOR MANUFACTURING THE SAME AND METHOD FOR DRIVING THE SAME, TOUCH PANEL AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Rui Xu, Beijing (CN); Shengji Yang, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 222 days.

(21) Appl. No.: 15/229,391

(22) Filed: Aug. 5, 2016

(65) Prior Publication Data

US 2017/0199603 A1    Jul. 13, 2017

(30) Foreign Application Priority Data

Jan. 8, 2016    (CN) .......................... 2016 1 0012402

(51) Int. Cl.
*G06F 3/041*    (2006.01)
*G06F 3/044*    (2006.01)
(Continued)

(52) U.S. Cl.
CPC ........ *G06F 3/0412* (2013.01); *G02F 1/13338* (2013.01); *G06F 3/044* (2013.01);
(Continued)

(58) Field of Classification Search
CPC ........ G06F 3/0412; G06F 3/416; G06F 3/044; G06F 2203/04103; G06F 2203/04104; G02F 1/13338; G02F 1/134309
See application file for complete search history.

(56) References Cited

U.S. PATENT DOCUMENTS 9,851,825 B2 * 12/2017 Kim ...................... G06F 3/0412
2003/0025848 A1    2/2003 Sera et al.
(Continued)

FOREIGN PATENT DOCUMENTS

CN    102955635 A    3/2013
CN    103926729 A    7/2014
(Continued)

OTHER PUBLICATIONS

China First Office Action, Application No. 201610012402.2, dated Feb. 11, 2018, 20 pps.: with English translation.

*Primary Examiner* — Lixi C Simpson
(74) *Attorney, Agent, or Firm* — Armstrong Teasdale LLP

(57) ABSTRACT

The embodiments of the disclosure provide an array substrate, a method for manufacturing the same and a method for driving the same, a touch panel and a display device. The manufacturing method includes forming a gate and a touch electrode pattern on a substrate, the touch electrode pattern including at least one touch electrode group, each touch electrode group including at least one touch electrode; forming a pixel electrode layer on the substrate formed with the touch electrode pattern; forming a first common electrode pattern on the substrate formed with the pixel electrode layer, the first common electrode pattern including at least one first common electrode group, each first common electrode group including at least one first common electrode, the first common electrode group and the touch electrode
(Continued)

group being used for forming mutual capacitance which changes when a finger acts on the touch panel.

18 Claims, 9 Drawing Sheets

(51) Int. Cl.
*G02F 1/1333* (2006.01)
*H01L 27/12* (2006.01)
*G02F 1/1343* (2006.01)

(52) U.S. Cl.
CPC .......... *G06F 3/0416* (2013.01); *H01L 27/124* (2013.01); *H01L 27/1255* (2013.01); *G02F 1/134309* (2013.01); *G06F 2203/04103* (2013.01); *G06F 2203/04104* (2013.01)

(56) References Cited

U.S. PATENT DOCUMENTS

| | | | |
|---|---|---|---|
| 2014/0028616 A1* | 1/2014 | Furutani | G06F 3/044 345/174 |
| 2017/0139518 A1* | 5/2017 | Oh | G06F 3/0414 |
| 2018/0088705 A1* | 3/2018 | Takahashi | G06F 3/044 |

FOREIGN PATENT DOCUMENTS

| | | |
|---|---|---|
| CN | 104330935 A | 2/2015 |
| CN | 104808375 A | 7/2015 |
| CN | 105094422 A | 11/2015 |

* cited by examiner

TOUCH INTEGRATED CIRCUIT

ARRAY SUBSTRATE, METHOD FOR MANUFACTURING THE SAME AND METHOD FOR DRIVING THE SAME, TOUCH PANEL AND DISPLAY DEVICE

CROSS REFERENCE TO RELATED APPLICATIONS

This application claims the priority of Chinese Patent Application No. 201610012402.2 filed on Jan. 8, 2016. The entire disclosure of the above application is incorporated herein by reference.

BACKGROUND

The embodiments of the disclosure relate to the field of display technology, in particular, an array substrate, a method for manufacturing the same and a method for driving the same, a touch panel and a display device.

Touch panels have been prevailing in people's life with a rapid development of display technology. Touch panels can be classified into two categories: on-cell touch panels and in-cell touch panels, wherein the in-cell touch panels can be further classified into three subcategories: capacitive touch panels, resistive touch panels and optical touch panels. A capacitive touch panel not only provides a friendly human-machine interface but also is operated smoothly, so it gets wide attention.

In the prior art, capacitive touch panels include self-capacitive touch panels and mutual-capacitive touch panels, wherein, in a mutual-capacitive touch panel, horizontal electrodes and longitudinal electrodes are formed on different layers of an array substrate, and capacitance is formed at the cross of a horizontal electrode and a longitudinal electrode which act as both electrodes of the capacitance. When a finger touches the mutual-capacitive touch panel, coupling between a horizontal electrode and a longitudinal electrode near the touch point is affected so as to change capacitance between the horizontal electrode and the longitudinal electrode. When a mutual-capacitive touch panel is detecting a mutual-capacitance value, all the horizontal electrodes transmit excitation signals and all the longitudinal electrodes receive the signals, capacitance values at the crosses of all the horizontal electrodes and all the longitudinal electrodes can thus be obtained, i.e., capacitance values of a two-dimensional plane of the entire mutual-capacitive touch panel. Based on the two-dimensional capacitance variation data, the mutual-capacitive touch panel calculates coordinates of each touch point.

The aforesaid mutual-capacitive touch panel can achieve multitouch, but its structure lacks diversity, so the manner for achieving multitouch lacks diversity as well.

BRIEF DESCRIPTION

The embodiments of the disclosure provide an array substrate, a method for manufacturing the same and a method for driving the same, a touch panel and a display device.

According to a first aspect of the disclosure, a method for manufacturing an array substrate is provided, comprising the steps of:

forming a gate and a touch electrode pattern on a substrate, the touch electrode pattern including at least one touch electrode group, each touch electrode group including at least one touch electrode; each touch electrode group being electrically connected with a touch integrated circuit;

forming a pixel electrode layer on the substrate formed with the touch electrode pattern;

forming a first common electrode pattern on the substrate formed with the pixel electrode layer, the first common electrode pattern including at least one first common electrode group, each first common electrode group including at least one first common electrode, each first common electrode group being electrically connected with the touch integrated circuit;

wherein, a direction in which touch electrodes in any touch electrode group are arranged is perpendicular to a direction in which first common electrodes in any first common electrode group are arranged; the first common electrode group and the touch electrode group are configured to form mutual capacitance which changes when a finger acts on a touch panel including the array substrate.

In the embodiments of the disclosure, the touch electrode pattern includes a touch electrode lead pattern including at least one touch electrode lead; each touch electrode group is electrically connected with the touch integrated circuit via a touch electrode lead.

In the embodiments of the disclosure, the touch electrode lead pattern is a second common electrode pattern including at least one second common electrode in shape of a bar; each touch electrode group is electrically connected with the touch integrated circuit via a second common electrode.

In the embodiments of the disclosure, the step of forming a pixel electrode layer on the substrate formed with the touch electrode pattern comprises:

forming a gate insulation layer on the substrate formed with the touch electrode pattern;

forming an active layer pattern on the substrate formed with the gate insulation layer;

forming a data line and a source and drain metal pattern on the substrate formed with the active layer pattern;

forming the pixel electrode layer on the substrate formed with the source and drain metal pattern.

In the embodiments of the disclosure, a passivation layer is formed on the substrate formed with the pixel electrode layer after forming the pixel electrode layer on the substrate formed with the source and drain metal pattern.

In the embodiments of the disclosure, projections of the touch electrode and the pixel electrode layer on the substrate have a first overlapping region;

projections of the pixel electrode layer and the first common electrode on the substrate have a second overlapping region.

In the embodiments of the disclosure, the touch electrode is made of a transparent conductive material.

In the embodiments of the disclosure, the touch electrode is a TX drive electrode; the first common electrode is a RX sense electrode.

According to a second aspect of the disclosure, it is provided an array substrate, comprising:

a substrate;

a gate and a touch electrode pattern formed on the substrate, the touch electrode pattern including at least one touch electrode group, each touch electrode group including at least one touch electrode; each touch electrode group being electrically connected with a touch integrated circuit;

a pixel electrode layer formed on the substrate formed with the touch electrode pattern;

a first common electrode pattern formed on the substrate formed with the pixel electrode layer, the first common electrode pattern including at least one first common electrode group, each first common electrode group including at least one first common electrode, each first common electrode group being electrically connected with the touch integrated circuit;

wherein, a direction in which touch electrodes in any touch electrode group are arranged is perpendicular to a direction in which first common electrodes in any first common electrode group are arranged; the first common electrode group and the touch electrode group are configured to form mutual capacitance which changes when a finger acts on a touch panel including the array substrate.

In the embodiments of the disclosure, the touch electrode pattern includes a touch electrode lead pattern including at least one touch electrode lead; each touch electrode group is electrically connected with the touch integrated circuit via a touch electrode lead.

In the embodiments of the disclosure, the touch electrode lead pattern is a second common electrode pattern including at least one second common electrode in shape of a bar; each touch electrode group is electrically connected with the touch integrated circuit via a second common electrode.

In the embodiments of the disclosure, the array substrate further comprises:

a gate insulation layer formed on the substrate formed with the touch electrode pattern;

an active layer pattern formed on the substrate formed with the gate insulation layer;

a data line and a source and drain metal pattern formed on the substrate formed with the active layer pattern.

In the embodiments of the disclosure, the array substrate further includes a passivation layer formed on the substrate formed with the pixel electrode layer.

According to a third aspect of the disclosure, it is provided a method for driving the array substrate according to the second aspect of the disclosure, the method comprising: in a display period, loading, by the touch integrated circuit, a common electrode signal to the touch electrode and the first common electrode; in a touch period, transmitting, by the touch electrode, an excitation signal under the control of the touch integrated circuit, and receiving, by the first common electrode, the excitation signal.

According to a fourth aspect of the disclosure, it is provided a touch panel including the array substrate according to the second aspect of the disclosure.

According to a fifth aspect of the disclosure, it is provided a display device including the touch panel according to the fourth aspect of the disclosure.

The disclosure provides an array substrate, a method for manufacturing the same and a method for driving the same, a touch panel and a display device. By forming a gate and a touch electrode pattern on a substrate, next forming a pixel electrode layer on the substrate formed with the touch electrode pattern, and then forming a first common electrode pattern on the substrate formed with the pixel electrode layer, the disclosure causes the touch electrode pattern and the first common electrode pattern to be located on both sides of the pixel electrode layer, respectively, diversifying achievable multitouch manners.

It should be understood that the aforesaid general description and the following detailed description are only exemplary and explanatory, but do not limit the disclosure.

BRIEF DESCRIPTION OF THE DRAWINGS

In order to illustrate the technical solutions of the embodiments of the disclosure more clearly, a brief introduction to figures of the embodiments is made as follows. Apparently, the following figures only relate to some embodiments of the disclosure, but do not limit the disclosure.

FIG. 2-1 is a flowchart illustrating another method for manufacturing an array substrate according to the embodiments of the disclosure;

FIG. 2-2 is a structural schematic diagram of the substrate formed with a gate and a touch electrode pattern in the embodiment shown in FIG. 2-1.

FIG. 2-3 is a schematic diagram of the touch electrode pattern in the embodiment shown in FIG. 2-1.

FIG. 2-4 is a structural schematic diagram of the substrate formed with a gate insulation layer in the embodiment shown in FIG. 2-1.

FIG. 2-5 is a structural schematic diagram of the substrate formed with an active layer pattern in the embodiment shown in FIG. 2-1.

FIG. 2-6 is a structural schematic diagram of the substrate formed with a source and drain metal pattern in the embodiment shown in FIG. 2-1.

FIG. 2-7 is a structural schematic diagram of the substrate formed with a pixel electrode layer in the embodiment shown in FIG. 2-1.

FIG. 2-8 is a structural schematic diagram of the substrate formed with a passivation layer in the embodiment shown in FIG. 2-1.

FIG. 2-9 is a structural schematic diagram of the substrate formed with a first common electrode pattern in the embodiment shown in FIG. 2-1.

FIG. 2-10 is a schematic diagram of the first common electrode pattern in the embodiment shown in FIG. 2-1.

FIG. 2-11 is a schematic diagram of the first common electrode group and the touch electrode group in the embodiment shown in FIG. 2-1.

FIG. 2-12 is a local schematic diagram of a planar structure of all the pixels in the embodiment shown in FIG. 2-1.

FIG. 2-13 is a cross-section schematic diagram taken along A-A' in FIG. 2-12.

FIG. 2-14 is a cross-section schematic diagram taken along B-B' in FIG. 2-12.

FIG. 2-15 is a schematic diagram of transmissivity of pixels in the embodiment shown in FIG. 2-1.

FIG. 3 is a structural schematic diagram of an array substrate according to embodiments of the disclosure.

FIG. 4 is a method for driving the array substrate according to embodiments of the disclosure.

The explicit embodiments of the disclosure have been shown by the aforesaid figures and a more detailed description will be made in the following text. These figures and literal description do not limit the scope of the disclosure in any way, but illustrate the concept of the disclosure to those skilled in the art by making reference to some specific embodiments.

DETAILED DESCRIPTION

In order to make the disclosure clearer, a clear and complete description of the disclosure shall be made in combination with figures of the embodiments of the disclosure. The embodiments to be described below are only some of embodiments, but not all the embodiments. Based on the described embodiments of the disclosure, those skilled in the art may obtain some other embodiments without creative work, but all the other embodiments shall fall within the protection scope of the disclosure.

Figure 1:
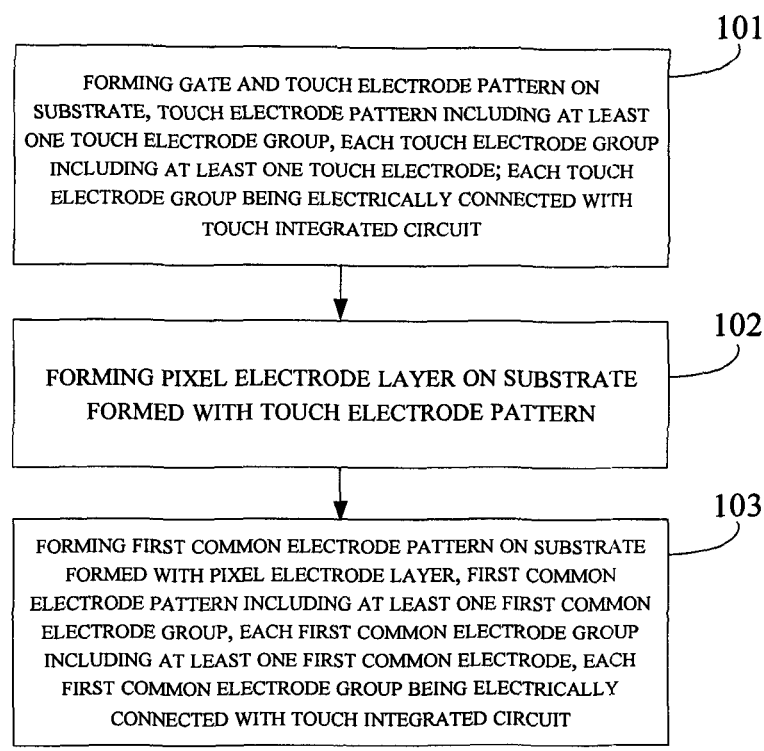
FIG. 1 is a flowchart illustrating a method for manufacturing an array substrate according to the embodiments of the disclosure.

The embodiments of the disclosure provide a method for manufacturing an array substrate. As shown in FIG. 1, the method may comprise:

Step 101: forming a gate and a touch electrode pattern on a substrate, the touch electrode pattern including at least one touch electrode group, each touch electrode group including at least one touch electrode; each touch electrode group being electrically connected with a touch integrated circuit;

Step 102: forming a pixel electrode layer on the substrate formed with the touch electrode pattern;

Step 103: forming a first common electrode pattern on the substrate formed with the pixel electrode layer, the first common electrode pattern including at least one first common electrode group, each first common electrode group including at least one first common electrode, each first common electrode group being electrically connected with the touch integrated circuit.

A direction in which touch electrodes in any of the touch electrode groups are arranged is perpendicular to a direction in which first common electrodes in any of the first common electrode groups are arranged; the first common electrode groups and the touch electrode groups are used for forming mutual capacitance which changes when a finger acts on a touch panel.

To sum up, by forming a gate and a touch electrode pattern on a substrate, next forming a pixel electrode layer on the substrate formed with the touch electrode pattern, and then forming a first common electrode pattern on the substrate formed with the pixel electrode layer, the method for manufacturing an array substrate according to the embodiments of the disclosure causes the touch electrode pattern and the first common electrode pattern to be located on both sides of the pixel electrode layer, respectively, diversifying achievable multitouch manners.

Figures 1, 2:
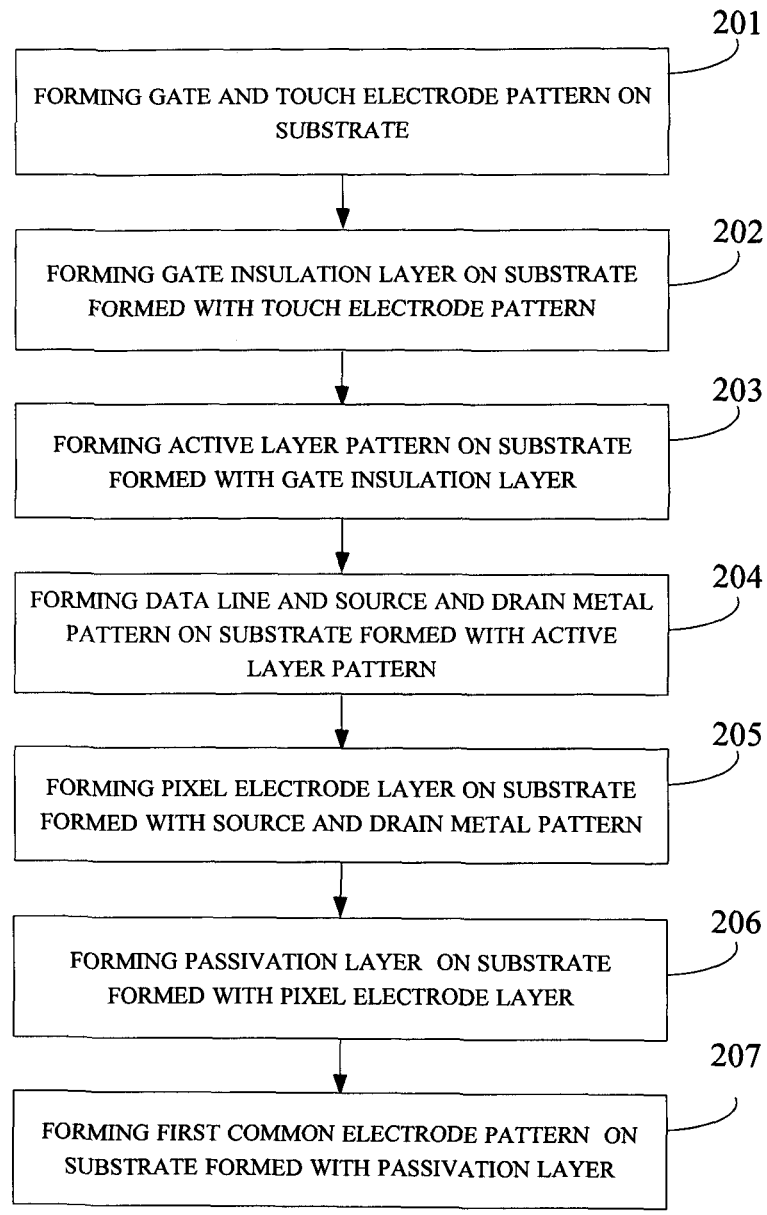
Figure 2:
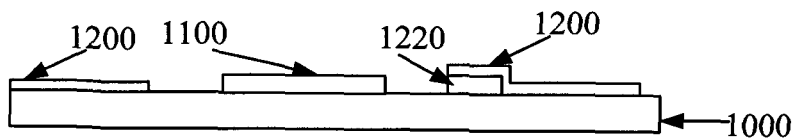

The embodiments of the disclosure provide another method for manufacturing an array substrate. As shown in FIG. 2-1, the method may comprise:

Step 201: forming a gate and a touch electrode pattern on a substrate.

Figures 2, 3:
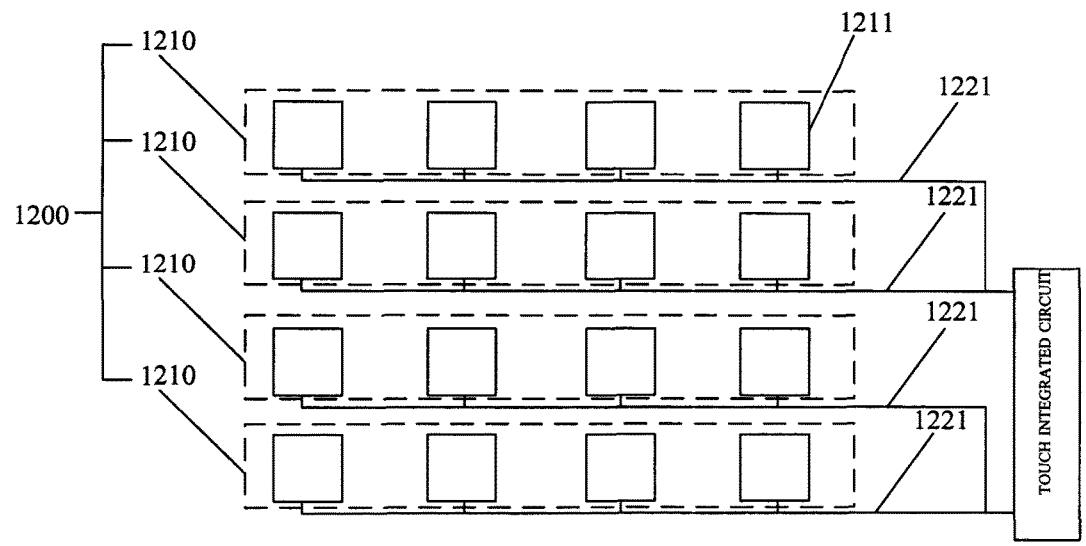

As shown in FIG. 2-2, processing such as film depositing, masking, exposing, etching and the like, is made to a substrate 1000 to form a gate 1100 and a touch electrode pattern 1200. The specific processes for film depositing, masking, exposing, etching can be found in the prior art, details thereof are not to be described here. As an example, a touch electrode is a TX drive electrode. As shown in FIG. 2-3, the touch electrode pattern 1200 includes at least one touch electrode group 1210, each touch electrode group 1210 including at least one touch electrode 1211, each touch electrode group 1210 being electrically connected with a touch integrated circuit.

Optionally, as shown in FIG. 2-2, the touch electrode pattern 1200 includes a touch electrode lead pattern 1220 including at least one touch electrode lead (not shown in FIG. 2-2). As shown in FIG. 2-3, each touch electrode group 1210 is electrically connected with the touch integrated circuit via a touch electrode lead 1221.

Optionally, at step 201, a gate and a touch electrode lead pattern may be first formed on the substrate, and then a TX drive electrode pattern is formed on the substrate formed with the touch electrode lead pattern. The touch electrode lead pattern may be a second common electrode pattern which includes at least one second common electrode in shape of a bar, and each touch electrode group is electrically connected with the touch integrated circuit via a second common electrode. The TX drive electrode pattern is lap jointed with the second common electrode pattern.

Step 202, a gate insulation layer is formed on the substrate formed with the touch electrode pattern.

Figures 2, 3, 4:
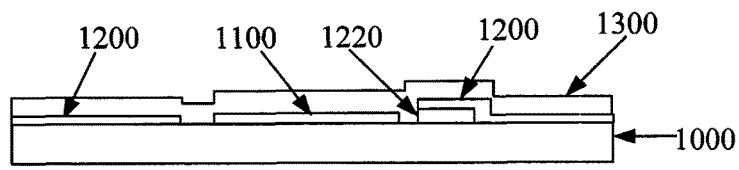
Figures 2, 3, 4, 5:
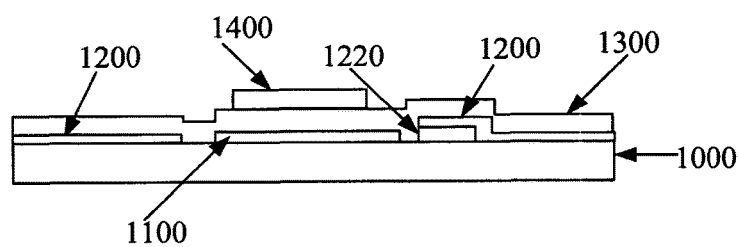
Figures 2, 3, 4, 5, 6:
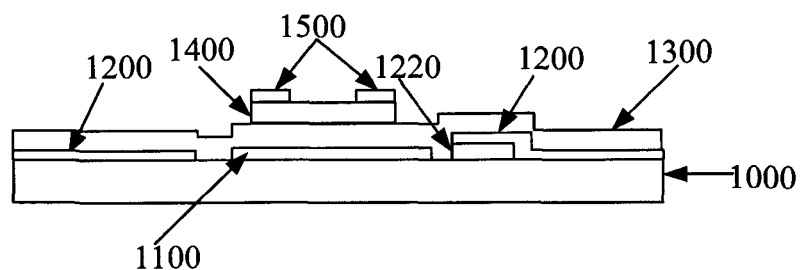
Figures 2, 3, 4, 5, 6, 7:
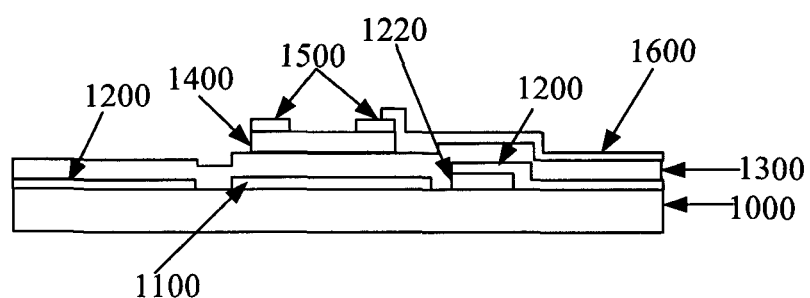
Figures 2, 3, 4, 5, 6, 7, 8:
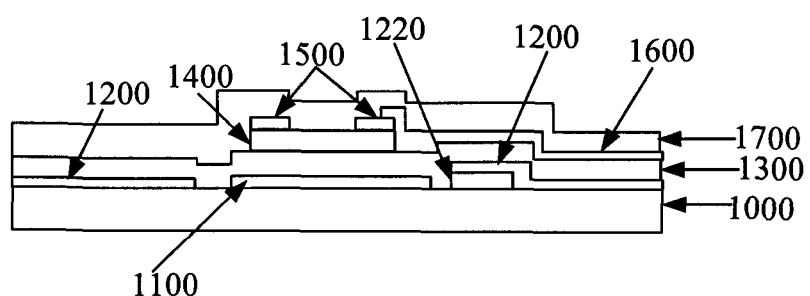
Figures 2, 3, 4, 5, 6, 7, 8, 9:
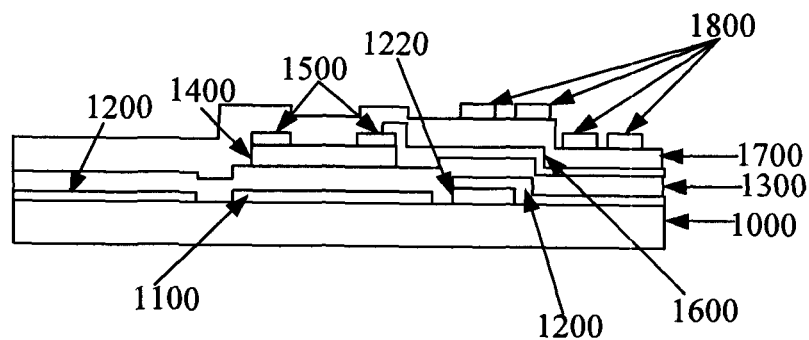
Figures 2, 3, 4, 5, 6, 7, 8, 9, 10:
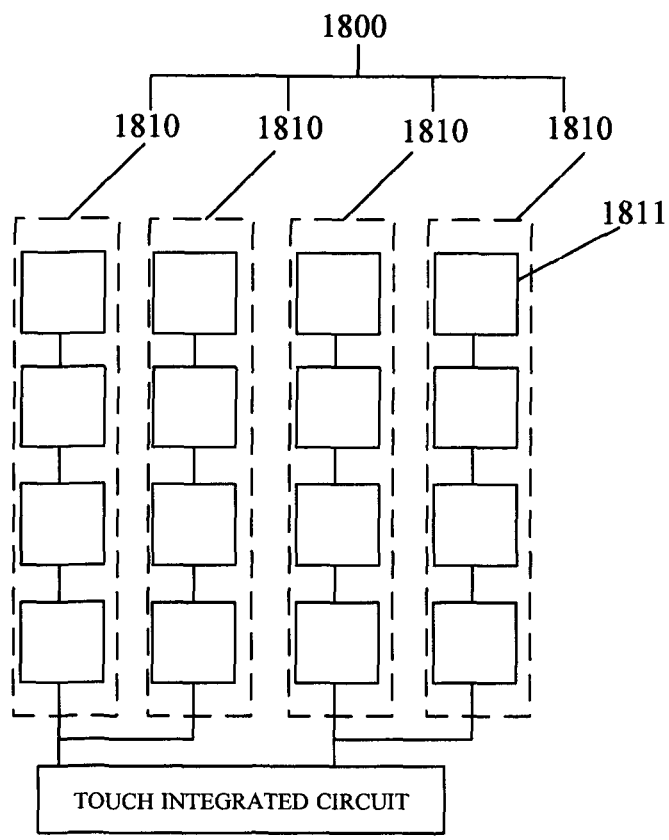
Figures 2, 3, 4, 5, 6, 7, 8, 9, 10, 11:
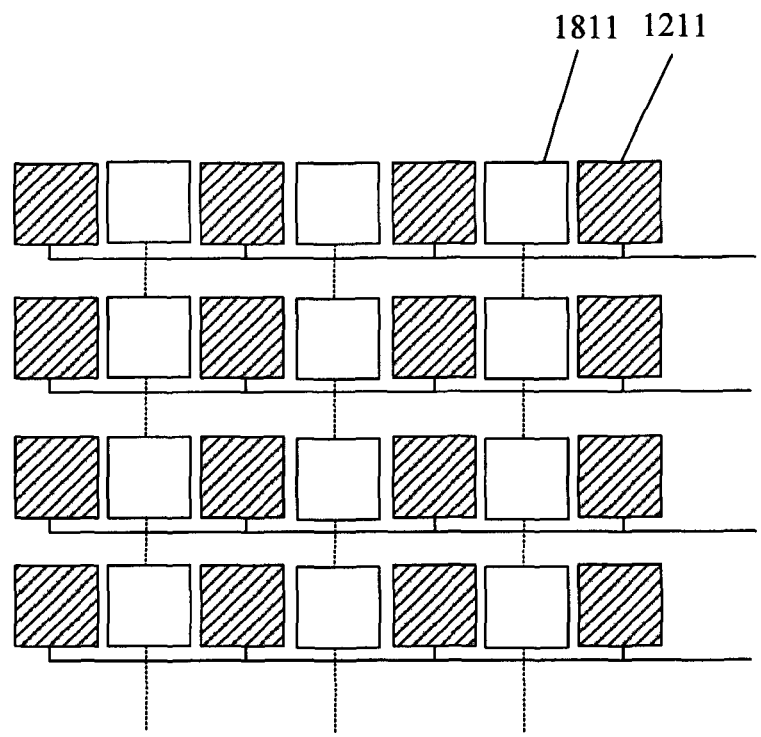
Figures 2, 3, 4, 5, 6, 7, 8, 9, 10, 11, 12:
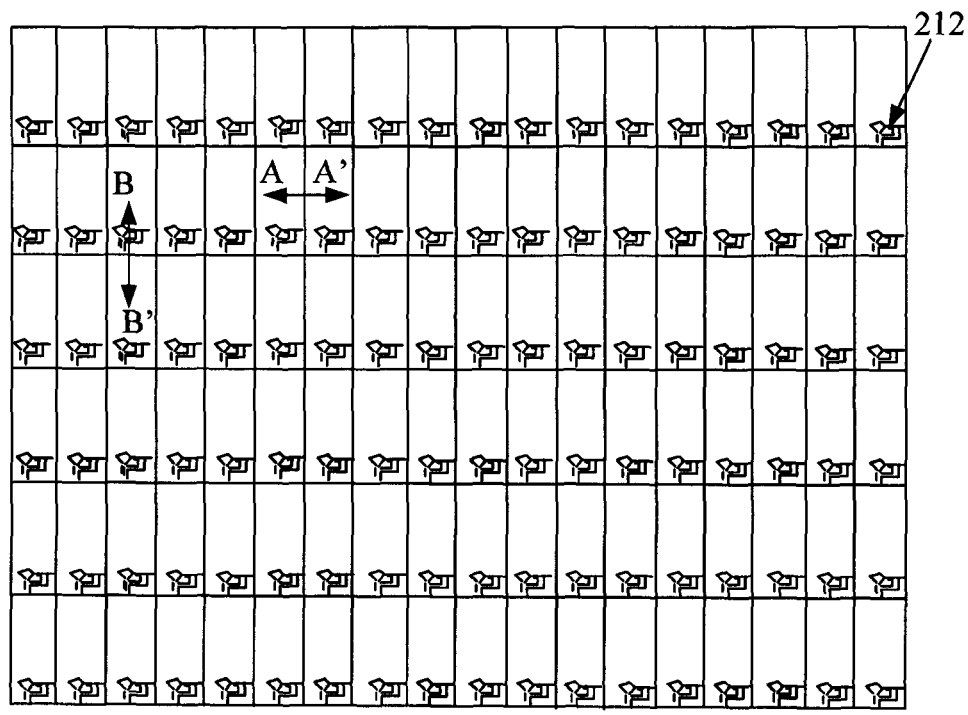
Figures 2, 3, 4, 5, 6, 7, 8, 9, 10, 11, 12, 13:
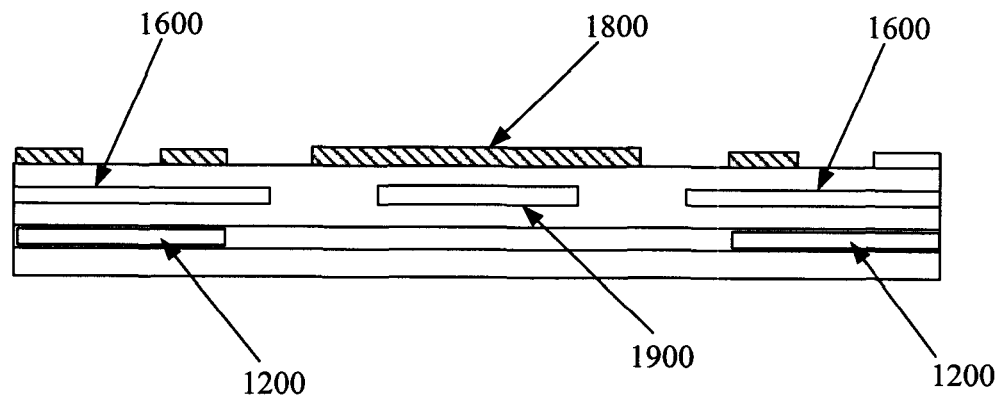
Figures 2, 3, 4, 5, 6, 7, 8, 9, 10, 11, 12, 13, 14:
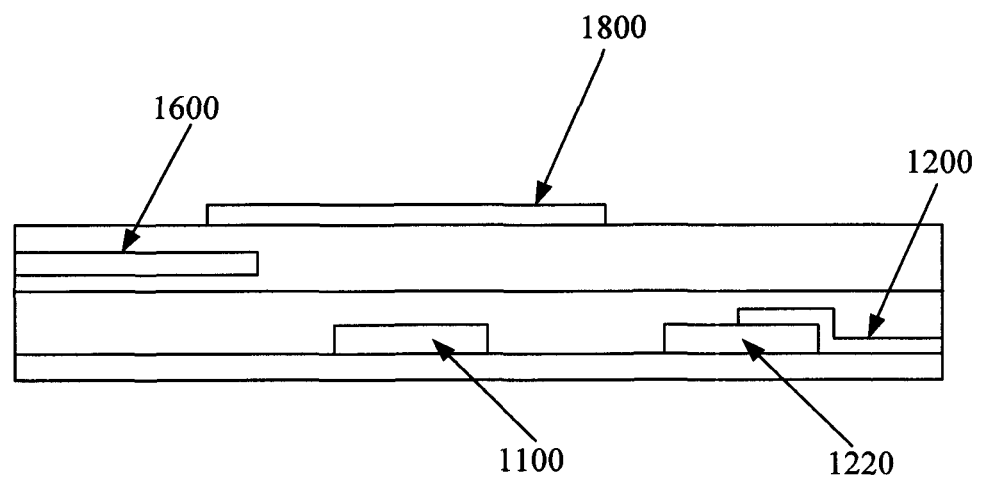
Figures 2, 3, 4, 5, 6, 7, 8, 9, 10, 11, 12, 13, 14, 15:
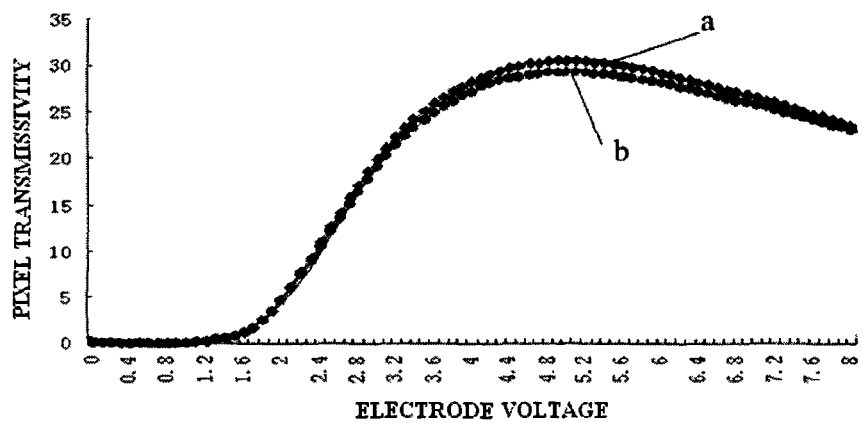
Figure 3:
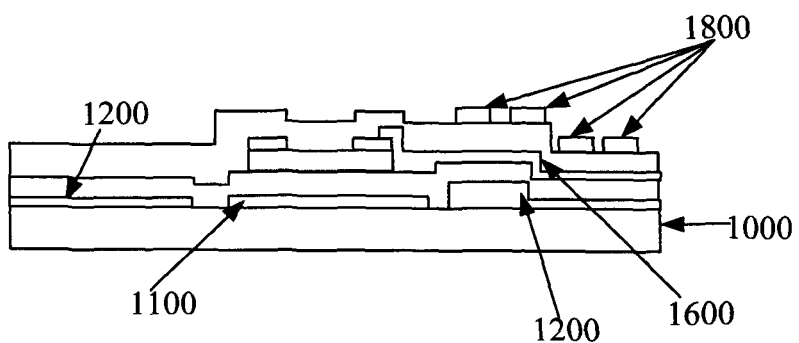
Figure 4:
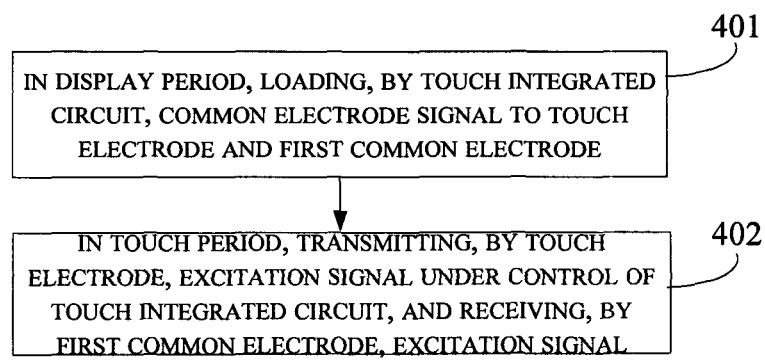

As shown in FIG. 2-4, processing such as film depositing, masking, exposing, etching and the like, is made to the substrate 1000 formed with the touch electrode pattern 1200, to form a gate insulation layer 1300.

Step 203, an active layer pattern is formed on the substrate formed with the gate insulation layer.

As shown in FIG. 2-5, processing such as amorphous silicon (a-Si) film depositing, masking, exposing, dry etching and the like, is made to the substrate 1000 formed with the gate insulation layer 1300, to form an active layer pattern 1400.

Step 204, a data line and a source and drain metal pattern are formed on the substrate formed with the active layer pattern.

As shown in FIG. 2-6, processing such as film depositing, masking, exposing, etching and the like, is made to the substrate 1000 formed with the active layer pattern 1400, to form a data line (not shown in FIG. 2-6) and a source and drain metal pattern 1500.

Step 205, a pixel electrode layer is formed on the substrate formed with the source and drain metal pattern.

As shown in FIG. 2-7, processing such as film depositing, masking, exposing, etching and the like, is made to the substrate 1000 formed with the source and drain metal pattern 1500, to form a pixel electrode layer 1600.

Step 206, a passivation layer is formed on the substrate formed with the pixel electrode layer.

As shown in FIG. 2-8, processing such as film depositing, masking, exposing, etching and the like, is made to the substrate 1000 formed with the pixel electrode layer 1600, to form a passivation layer 1700.

Step 207, a first common electrode pattern is formed on the substrate formed with the passivation layer.

As shown in FIG. 2-9, processing such as film depositing, masking, exposing, etching and the like, is made to the substrate 1000 formed with the passivation layer 1700, to form a first common electrode pattern 1800.

Furthermore, as shown in FIG. 2-10, the first common electrode pattern 1800 includes at least one first common electrode group 1810; each first common electrode group 1810 includes at least one first common electrode 1811; each first common electrode group 1810 is electrically connected with the touch integrated circuit. As an example, the first common electrode is a RX sense electrode. As shown in FIG. 2-11, a direction in which touch electrodes 1211 in any of the touch electrode groups are arranged is perpendicular to a direction in which first common electrodes 1811 in any of the first common electrode groups are arranged; the first common electrode groups and the touch electrode groups are used for forming mutual capacitance which changes when a finger acts on the touch panel. Projections of the touch electrodes and a projection of the pixel electrode layer on the substrate have first overlapping regions; a projection of the pixel electrode layer and projections of the first common electrodes on the substrate have second overlapping regions. In a display period, the touch integrated circuit loads a common electrode signal to the touch electrodes and the first common electrodes, so storage capacitance of all the pixels is formed by capacitance between the touch electrodes and the pixel electrode layer being in parallel with capacitance between the pixel electrode layer and the first common electrodes, and storage capacitance of all the pixels is a sum of the two capacitances, which consequently increases storage capacitance of the pixels, boosts a charging rate of the pixels, and improves image display quality.

Optionally, the touch electrode is made of a transparent conductive material, because of which a comparatively large area of touch electrodes can be formed. An increase of the area of the touch electrodes may increase capacitance between the touch electrodes and the pixel electrode layer to further increase storage capacitance within a display period.

FIG. 2-12 shows a local schematic diagram of a planar structure of all the pixels on the array substrate according to the embodiments of the disclosure. 212 in FIG. 2-12 indicates a thin film transistor (TFT). FIG. 2-13 shows a cross-section diagram taken along A-A' in FIG. 2-12. In FIG. 2-13, 1200 indicates a touch electrode pattern; 1900 indicates a data line layer; 1600 indicates a pixel electrode layer; and 1800 indicates a first common electrode pattern. FIG. 2-14 shows a cross-section diagram taken along B-B' in FIG. 2-12. In FIG. 2-14, 1100 indicates a gate; 1220 indicates a touch electrode lead pattern; 1200 indicates a touch electrode pattern; 1600 indicates a pixel electrode layer; and 1800 indicates a first common electrode pattern. In a display period, the touch integrated circuit loads a common electrode signal to the touch electrodes and the first common electrodes, so storage capacitance of all the pixels is formed by capacitance between the touch electrodes and the pixel electrode layer being in parallel with capacitance between the pixel electrode layer and the first common electrodes, and storage capacitance of all the pixels is a sum of the two capacitances, which consequently increases storage capacitance of the pixels, boosts a charging rate of the pixels, and improves image display quality.

FIG. 2-15 shows a schematic diagram of transmissivity of pixels of the array substrate according to the embodiments of the disclosure. In this figure, the abscissa represents electrode voltage whose unit is volt (V); the ordinate represents pixel transmissivity (percentage); curve a is a pixel transmissivity in the prior art; curve b is a pixel transmissivity in the embodiments of the disclosure. As can be seen from FIG. 2-15, when the electrode voltage (i.e., drive voltage) is at a maximum, the pixel transmissivity is approximate to pixel transmissivities in the prior art. Thus, on the basis that both TX electrodes and RX electrodes are on the array substrate in the process of achieving mutual capacitance technology, the array substrate ensures display effect of the pixels within a display period.

The array substrate according to the embodiments of the disclosure is driven in a time-division manner. In a touch period, the touch electrodes transmit excitation signals under the control of the touch integrated circuit, and the first common electrodes receive the excitation signals, so that the pixels provide TX signals and RX signals in different regions, respectively. In a display period, the touch integrated circuit loads a common electrode signal to the touch electrodes and the first common electrodes, so storage capacitance of the pixels is formed by capacitance between the touch electrodes and the pixel electrode layer being in parallel with capacitance between the pixel electrode layer and the first common electrodes, and storage capacitance of all the pixels is a sum of the two capacitances, which consequently increases storage capacitance of the pixels, boosts a charging rate of the pixels, and improves image display quality. The array substrate is applicable for a design of a full in-cell touch panel having a high pixel per inch (PPI). Meanwhile, transmissivity of this pixel design is also approximate to transmissivities of the existing pixel designs. Therefore, mutual capacitance technology is achieved by such an array substrate through a simple process, and image display quality is improved. A module structure of a mutual-capacitance full-in-cell touch panel including such an array substrate comprises an array substrate, a liquid crystal layer and a color film substrate from the bottom up, wherein the array substrate is designed with a pixel structure in which common electrodes form TX electrodes and RX electrodes of mutual capacitance. Apart from this, signal lines outside a display region, a display integrated circuit and a touch integrated circuit connected with the signal lines are formed on the array substrate. When a finger touches an upper surface of the module, mutual capacitance formed by the TX electrodes and the RX electrodes changes, and a display device locks an x-coordinate and a y-coordinate of a touch point in a two-dimensional plane of the touch panel by virtue of TX electrode signals and RX electrodes signals, so as to obtain a position of the touch point.

The method for manufacturing an array substrate according to the embodiments of the disclosure does not change an overall structure of pixels but merely adds a touch electrode pattern which may be made of indium tin oxide (ITO), and achieves mutual capacitance technology by designing mutual capacitance on the array substrate.

To sum up, by forming a gate and a touch electrode pattern on the substrate, next forming a pixel electrode layer on the substrate formed with the touch electrode pattern, and then forming a first common electrode pattern on the substrate formed with the pixel electrode layer, the method for manufacturing an array substrate according to the embodiments of the disclosure causes the touch electrode pattern and the first common electrode pattern to be located on both sides of the pixel electrode layer, respectively, diversifying achievable multitouch manners, increasing storage capacitance of the pixels within a display period, boosting a charging rate of the pixels, and improving image display quality.

The embodiments of the disclosure provide an array substrate. As shown in FIG. 3, the array substrate may comprise:

a substrate 1000;

a gate 1100 and a touch electrode pattern 1200 formed on the substrate 1000, the touch electrode pattern 1200 including at least one touch electrode group 1210, each touch electrode group 1210 including at least one touch electrode 1211; each touch electrode group 1210 being electrically connected with a touch integrated circuit;

a pixel electrode layer 1600 formed on the substrate 1000 formed with the touch electrode pattern 1200;

a first common electrode pattern 1800 formed on the substrate 1000 formed with the pixel electrode layer 1600, the first common electrode pattern 1800 including at least one first common electrode group 1810, each first common electrode group 1810 including at least one first common electrode 1811, each first common electrode group 1811 being electrically connected with the touch integrated circuit.

As shown in FIG. 2-11, a direction in which touch electrodes 1211 in any of the touch electrode groups are arranged is perpendicular to a direction in which first common electrodes 1811 in any of the first common electrode groups are arranged; the first common electrode groups and the touch electrode groups are used for forming mutual capacitance which changes when a finger acts on a touch panel.

To sum up, for the array substrate according to the embodiments of the disclosure, a gate and a touch electrode pattern are formed on the substrate of the array substrate; a pixel electrode layer is formed on the substrate formed with the touch electrode pattern; and a first common electrode pattern is formed on the substrate formed with the pixel electrode layer; the touch electrode pattern and the first common electrode pattern on the array substrate are located on both sides of the pixel electrode layer, respectively, which diversifies achievable multitouch manners.

Furthermore, projections of the touch electrodes and a projection of the pixel electrode layer on the substrate have first overlapping regions; a projection of the pixel electrode layer and projections of the first common electrodes on the substrate have second overlapping regions. In a display period, the touch integrated circuit loads a common electrode signal to the touch electrodes and the first common electrodes, so storage capacitance of all the pixels is formed by capacitance between the touch electrodes and the pixel electrode layer being in parallel with capacitance between the pixel electrode layer and the first common electrodes, and storage capacitance of all the pixels is a sum of the two capacitances, which consequently increases storage capacitance of the pixels, boosts a charging rate of the pixels, and improves image display quality.

Optionally, the touch electrode is made of a transparent conductive material, because of which a comparatively large area of touch electrodes can be formed. An increase of the area of the touch electrodes may increase capacitance between the touch electrodes and the pixel electrode layer to further increase storage capacitance within a display period.

Optionally, as shown in FIG. 2-9, the touch electrode pattern 1200 includes a touch electrode lead pattern 1220 including at least one touch electrode lead (not shown in FIG. 2-9). As shown in FIG. 2-3, each touch electrode group 1210 is electrically connected with the touch integrated circuit via a touch electrode lead 1221.

Optionally, the touch electrode lead pattern is a second common electrode pattern which includes at least one second common electrode in shape of a bar, and each touch electrode group is electrically connected with the touch integrated circuit via a second common electrode.

Furthermore, as shown in FIG. 2-9, the array substrate further comprises:

a gate insulation layer 1300 formed on the substrate 1000 formed with the touch electrode pattern 1200;

an active layer pattern 1400 formed on the substrate 1000 formed with the gate insulation layer 1300;

a data line (not shown in FIG. 2-9) and a source and drain metal pattern 1500 formed on the substrate 1000 formed with the active layer pattern 1400;

a pixel electrode layer 1600 formed on the substrate 1000 formed with the source and drain metal pattern 1500.

As shown in FIG. 2-9, the array substrate further comprises:

a passivation layer 1700 formed on the substrate 1000 formed with the pixel electrode layer 1600.

The array substrate according to the embodiments of the disclosure is driven in a time-division manner. In a touch period, the touch electrodes transmit excitation signals under the control of the touch integrated circuit, and the first common electrodes receive the excitation signals, so that pixels provide TX signals and RX signals in different regions, respectively. In a display period, the touch integrated circuit loads a common electrode signal to the touch electrodes and the first common electrodes, so storage capacitance of the pixels is formed by capacitance between the touch electrodes and the pixel electrode layer being in parallel with capacitance between the pixel electrode layer and the first common electrodes, and storage capacitance of all the pixels is a sum of the two capacitances, which consequently increases storage capacitance of the pixels, boosts a charging rate of the pixels, and improves image display quality. The array substrate is applicable for a design of a full in-cell touch panel having a high pixel per inch (PPI). Meanwhile, transmissivity of this pixel design is also approximate to transmissivities of the existing pixel designs. Therefore, mutual capacitance technology is achieved by such an array substrate through a simple process, and image display quality is improved. A module structure of a mutual-capacitance full-in-cell touch panel including such an array substrate comprises an array substrate, a liquid crystal layer and a color film substrate from the bottom up, wherein the array substrate is designed with a pixel structure in which common electrodes form TX electrodes and RX electrodes of mutual capacitance. Apart from this, signal lines outside a display region, a display integrated circuit and a touch integrated circuit connected with the signal lines are formed on the array substrate. When a finger touches an upper surface of the module, mutual capacitance formed by the TX electrodes and the RX electrodes changes, and a display device locks an x-coordinate and a y-coordinate of a touch point in a two-dimensional plane of the touch panel by virtue of TX electrode signals and RX electrodes signals, so as to obtain a position of the touch point.

To sum up, for the array substrate according to the embodiments of the disclosure, a gate and a touch electrode pattern are formed on the substrate of the array substrate; a pixel electrode layer is formed on the substrate formed with the touch electrode pattern; and a first common electrode pattern is formed on the substrate formed with the pixel electrode layer; the touch electrode pattern and the first common electrode pattern on the array substrate are located on both sides of the pixel electrode layer, respectively, which diversifies achievable multitouch manners, increases storage capacitance of the pixels within a display period, boosts a charging rate of the pixels, and improves image display quality. Meanwhile, the array substrate has a simple structure and can be easily achieved.

The embodiments of the disclosure provide a method for driving the array substrate. As shown in FIG. 4, the method may comprise:

Step 401: in a display period, loading, by the touch integrated circuit, a common electrode signal to the touch electrodes and the first common electrodes;

Step 402: in a touch period, transmitting, by the touch electrodes, excitation signals under the control of the touch integrated circuit, and receiving, by the first common electrodes, the excitation signals.

Specifically, as shown in FIG. 2-3, the touch electrode pattern 1200 includes at least one touch electrode group 1210, each touch electrode group 1210 including at least one touch electrode 1211, each touch electrode group 1210 being electrically connected with a touch integrated circuit. As shown in FIG. 2-2, the touch electrode pattern 1200 includes a touch electrode lead pattern 1220 including at least one touch electrode lead (not shown in FIG. 2-2). As shown in FIG. 2-3, each touch electrode group 1210 is electrically connected with the touch integrated circuit via a touch electrode lead 1221.

As shown in FIG. 2-10, the first common electrode pattern 1800 includes at least one first common electrode group 1810; each first common electrode group 1810 includes at least one first common electrode 1811; each first common electrode group 1810 is electrically connected with the touch integrated circuit via a metal lead. Thus, the touch integrated circuit can load a common electrode signal to the touch electrodes and the first common electrodes within a display period.

When a finger touches a touch panel, mutual capacitance formed by the touch electrodes and the first common electrodes changes. When the touch panel is detecting a mutual-capacitance value, the touch electrodes transmit excitation signals under the control of the touch integrated circuit, and the first common electrodes receive the excitation signals. A display device locks an x-coordinate and a y-coordinate of a touch point in a two-dimensional plane of the touch panel by virtue of touch electrode signals and first common electrodes signals, so as to obtain a position of the touch point.

The array substrate according to the embodiments of the disclosure is driven in a time-division manner. Specifically, in a touch period, the touch electrodes transmit excitation signals under the control of the touch integrated circuit, and the first common electrodes receive the excitation signals, so that pixels provide TX signals and RX signals in different regions, respectively. In a display period, the touch integrated circuit loads a common electrode signal to the touch electrodes and the first common electrodes, so storage capacitance of the pixels is formed by capacitance between the touch electrodes and the pixel electrode layer being in parallel with capacitance between the pixel electrode layer and the first common electrodes, and storage capacitance of all the pixels is a sum of the two capacitances, which consequently increases storage capacitance of the pixels, boosts a charging rate of the pixels, and improves image display quality. The array substrate is applicable for a design of a full in-cell touch panel having a high pixel per inch (PPI). Meanwhile, transmissivity of this pixel design is also approximate to transmissivities of the existing pixel designs. Therefore, mutual capacitance technology is achieved by such an array substrate through a simple process, and improves image display quality.

To sum up, according to the method for driving the array substrate provided in the embodiments of the disclosure, in a display period, the touch integrated circuit loads a common electrode signal to the touch electrodes and the first common electrodes; in a touch period, the touch electrodes transmit excitation signals under the control of the touch integrated circuit, and the first common electrodes receive the excitation signals. In a display period, the touch integrated circuit loads a common electrode signal to the touch electrodes and the first common electrodes, so storage capacitance of the pixels is formed by capacitance between the touch electrodes and the pixel electrode layer being in parallel with capacitance between the pixel electrode layer and the first common electrodes, and storage capacitance of all the pixels is a sum of the two capacitances, which consequently increases storage capacitance of the pixels, boosts a charging rate of the pixels, and improves image display quality.

The embodiments of the disclosure provide a touch panel, including the array substrate shown in FIG. 3 or FIG. 2-9. The touch panel, for example, is a liquid crystal touch panel. A gate and a touch electrode pattern are formed on the substrate of the array substrate of the touch panel; a pixel electrode layer is formed on the substrate formed with the touch electrode pattern; and a first common electrode pattern is formed on the substrate formed with the pixel electrode layer; the touch electrode pattern and the first common electrode pattern on the array substrate are located on both sides of the pixel electrode layer, respectively, which diversifies achievable multitouch manners, increases storage capacitance of the pixels, boosts a charging rate of the pixels, and improves image display quality.

The embodiments of the disclosure provide a display device, including the touch panel above. The display device is, for example, a liquid crystal TV, a cellphone, a tablet computer, and a navigator and the like. A gate and a touch electrode pattern are formed on the substrate of the array substrate of the display device; a pixel electrode layer is formed on the substrate formed with the touch electrode pattern; and a first common electrode pattern is formed on the substrate formed with the pixel electrode layer; the touch electrode pattern and the first common electrode pattern on the array substrate are located on both sides of the pixel electrode layer, respectively, which diversifies achievable multitouch manners, increases storage capacitance of the pixels within a display period, boosts a charging rate of the pixels, and improves image display quality.

The aforesaid embodiments are only exemplary embodiments of the disclosure, but do not serve as restrictions on the protection scope of the disclosure. The protection scope of the disclosure is determined by the claims enclosed.

What is claimed is:

1. A method for manufacturing an array substrate, characterized by comprising the steps of:
    forming a gate and a touch electrode pattern on a substrate, the touch electrode pattern including at least one touch electrode group, each touch electrode group including at least one touch electrode, each touch electrode group being electrically connected with a touch integrated circuit;
    forming a pixel electrode layer on the substrate formed with the touch electrode pattern;
    forming a passivation layer on the pixel electrode layer;
    forming a first common electrode pattern immediately on the passivation layer, the first common electrode pattern including at least one first common electrode group, each first common electrode group including at least one first common electrode, each first common electrode group being electrically connected with the touch integrated circuit;
    wherein, a direction in which touch electrodes in any touch electrode group are arranged is perpendicular to a direction in which first common electrodes in any first common electrode group are arranged, and the first common electrode group and the touch electrode group are configured to form mutual capacitance which changes when a finger acts on a touch panel including the array substrate.

2. The method according to claim 1, characterized in that the touch electrode pattern includes a touch electrode lead pattern including at least one touch electrode lead; each touch electrode group is electrically connected with the touch integrated circuit via a touch electrode lead.

3. The method according to claim 2, characterized in that the touch electrode lead pattern is a second common electrode pattern including at least one second common electrode in shape of a bar; each touch electrode group is electrically connected with the touch integrated circuit via a second common electrode.

4. The method according to claim 1, characterized in that the step of forming a pixel electrode layer on the substrate formed with the touch electrode pattern comprises:
    forming a gate insulation layer on the substrate formed with the touch electrode pattern;
    forming an active layer pattern on the substrate formed with the gate insulation layer;

forming a data line and a source and drain metal pattern on the substrate formed with the active layer pattern;

forming the pixel electrode layer on the substrate formed with the source and drain metal pattern.

5. The method according to claim 1, characterized in that projections of the touch electrode and the pixel electrode layer on the substrate have a first overlapping region;

projections of the pixel electrode layer and the first common electrode on the substrate have a second overlapping region.

6. The method according to claim 1, characterized in that the touch electrode is made of a transparent conductive material.

7. The method according to claim 1, characterized in that the touch electrode is a TX drive electrode; and the first common electrode is a RX sense electrode.

8. An array substrate comprising:

a substrate;

a gate and a touch electrode pattern positioned on the substrate, the touch electrode pattern including at least one touch electrode group, each touch electrode group including at least one touch electrode; each touch electrode group being electrically connected with a touch integrated circuit;

a pixel electrode layer positioned on the substrate positioned with the touch electrode pattern;

a passivation layer positioned on the pixel electrode layer;

a first common electrode pattern immediately positioned on the passivation layer, the first common electrode pattern including at least one first common electrode group, each first common electrode group including at least one first common electrode, each first common electrode group being electrically connected with the touch integrated circuit;

wherein a direction in which touch electrodes in any touch electrode group are arranged is perpendicular to a direction in which first common electrodes in any first common electrode group are arranged, and the first common electrode group and the touch electrode group are configured to form mutual capacitance which changes when a finger acts on a touch panel including the array substrate.

9. The array substrate according to claim 8, characterized in that the touch electrode pattern includes a touch electrode lead pattern including at least one touch electrode lead; each touch electrode group is electrically connected with the touch integrated circuit via a touch electrode lead.

10. The array substrate according to claim 9, characterized in that the touch electrode lead pattern is a second common electrode pattern including at least one second common electrode having a shape of a bar; each touch electrode group is electrically connected with the touch integrated circuit via a second common electrode.

11. A method for driving the array substrate according to claim 10, comprising:

in a display period, loading, by the touch integrated circuit, a common electrode signal to the touch electrode and the first common electrode;

in a touch period, transmitting, by the touch electrode, an excitation signal under the control of the touch integrated circuit, and receiving, by the first common electrode, the excitation signal.

12. A method for driving the array substrate according to claim 9, comprising:

in a display period, loading, by the touch integrated circuit, a common electrode signal to the touch electrode and the first common electrode;

in a touch period, transmitting, by the touch electrode, an excitation signal under the control of the touch integrated circuit, and receiving, by the first common electrode, the excitation signal.

13. A touch panel, characterized by including the array substrate according to claim 9.

14. A display device, characterized by including the touch panel according to claim 13.

15. The array substrate according to claim 8, wherein the array substrate further comprises:

a gate insulation layer positioned on the substrate formed with the touch electrode pattern;

an active layer pattern positioned on the substrate formed with the gate insulation layer;

a data line and a source and drain metal pattern positioned on the substrate formed with the active layer pattern.

16. A method for driving the array substrate according to claim 8, comprising:

in a display period, loading, by the touch integrated circuit, a common electrode signal to the touch electrode and the first common electrode;

in a touch period, transmitting, by the touch electrode, an excitation signal under the control of the touch integrated circuit, and receiving, by the first common electrode, the excitation signal.

17. A touch panel, characterized by including the array substrate according to claim 8.

18. A display device, characterized by including the touch panel according to claim 17.

* * * * *

UNITED STATES PATENT AND TRADEMARK OFFICE
CERTIFICATE OF CORRECTION

PATENT NO. : 10,459,552 B2
APPLICATION NO. : 15/229391
DATED : October 29, 2019
INVENTOR(S) : Rui Xu et al.

Page 1 of 1

It is certified that error appears in the above-identified patent and that said Letters Patent is hereby corrected as shown below:

In the Claims

In Claim 1, Column 12, Line 34, delete "electrode laver" and insert therefor -- electrode layer --.

Signed and Sealed this
Twenty-fourth Day of December, 2019

Andrei Iancu
*Director of the United States Patent and Trademark Office*